United States Patent [19]
Urano et al.

[11] Patent Number: 6,153,356
[45] Date of Patent: Nov. 28, 2000

[54] PHOTOPOLYMERIZABLE COMPOSITION, PHOTOPOLYMERIZABLE LITHOGRAPHIC PRINTING PLATE AND PROCESS FOR FORMING AN IMAGE

[75] Inventors: Toshiyuki Urano; Takumi Nagao; Etsuko Hino, all of Kanagawa, Japan

[73] Assignee: Mitsubishi Chemical Corporation, Tokyo, Japan

[21] Appl. No.: 09/374,846

[22] Filed: Aug. 16, 1999

[30] Foreign Application Priority Data

Aug. 17, 1998 [JP] Japan .................................. 10-230373

[51] Int. Cl.$^7$ ..................................... G03F 7/028
[52] U.S. Cl. ........................ 430/281.1; 430/926; 430/302; 522/75
[58] Field of Search ................................. 430/281.1, 302, 430/926; 522/75

[56] References Cited

U.S. PATENT DOCUMENTS

| | | | |
|---|---|---|---|
| 4,997,745 | 3/1991 | Kawamura et al. | 430/281 |
| 5,219,709 | 6/1993 | Nagasaka et al. | 430/281 |
| 5,723,260 | 3/1998 | Tsuji et al. | 430/278.1 |
| 5,738,974 | 4/1998 | Nagasaka et al. | 430/278.1 |
| 5,800,965 | 9/1998 | Tsuji et al. | 430/287.1 |
| 5,814,431 | 9/1998 | Nagasaka et al. | 430/281.1 |
| 5,837,422 | 11/1998 | Sasaki et al. | 430/284.1 |

FOREIGN PATENT DOCUMENTS

| | | |
|---|---|---|
| 58-29803 | 2/1983 | Japan . |
| 4-31863 | 2/1992 | Japan . |

*Primary Examiner*—Janet Baxter
*Assistant Examiner*—Rosemary Ashton
*Attorney, Agent, or Firm*—Oblon, Spivak, McClelland, Maier & Neustadt, P.C.

[57] ABSTRACT

A photopolymerizable composition comprising (A) an ethylenically unsaturated compound, (B) a cyanine dye and (C) a photopolymerization initiator, wherein the cyanine dye of component (B) is a cyanine dye of a structure having hetero atoms connected via a polymethine chain, and the polymethine chain has at least one substituent of the following formula (α):

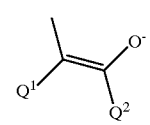

(α)

wherein $Q^1$ and $Q^2$ are optional substituents, which may be connected to form a ring.

14 Claims, No Drawings

PHOTOPOLYMERIZABLE COMPOSITION, PHOTOPOLYMERIZABLE LITHOGRAPHIC PRINTING PLATE AND PROCESS FOR FORMING AN IMAGE

BACKGROUND OF THE INVENTION

1. Field of the Invention

The present invention relates to a photopolymerizable composition and a photopolymerizable lithographic printing plate. Particularly, it relates to a photopolymerizable composition showing high sensitivity to a light in a long wavelength region, a photopolymerizable lithographic printing plate and a process for forming an image.

2. Discussion of Background

Heretofore, as methods for forming images by exposure of photopolymerizable compositions, various methods have been known, such as, a method wherein a layer of a photopolymerizable composition comprising an ethylenically unsaturated compound and a photopolymerization initiator, or comprising an organic polymer binder material in addition to them, is formed on the surface of a support and then subjected to image exposure so that the ethylenically unsaturated compound at the exposed portion is polymerized and cured, and then the non-exposed portion is dissolved and removed to form a cured relief image, a method wherein a layer of a photopolymerizable composition is exposed to change the bond strength of the layer to the support, and then the support is peeled to form an image, and a method wherein a change in the adhesion of a toner to the layer of a photopolymerizable composition due to light, is utilized to form an image. As the photopolymerization initiator, one which is sensitive to light with a short wavelength within an ultraviolet region of at most 400 nm, has been used, such as benzoin, benzoin alkyl ether, benzyl ketal, benzophenone, anthraquinone, benzyl ketone or Michler's ketone.

On the other hand, in recent years, a photosensitive material showing high sensitivity to a light within a visible light range has been strongly demanded along with the development of the image-forming technology, and many photopolymerizable compositions have been proposed, whereby the sensitivity range has been broadened to about 500 nm corresponding to a laser printing plate making system employing an oscillation beam of an argon ion laser of 488 rm. Further, researches have been actively carried out on photopolymerizable compositions sensitive to a light within a long wavelength region exceeding 600 nm corresponding to a laser printing plate making system employing a He—Ne laser or a semiconductor laser or a copying technique for full color image.

For example, JP-A-58-29803 and JP-A-4-31863 disclose a photopolymerizable composition comprising an ethylenically unsaturated compound and a photopolymerization initiating system, wherein the photopolymerization initiating system comprises a cyanine dye having heterocyclic rings connected by a mono-, tri-, penta- or hepta-methine chain and having a certain specific structure, and a s-triazine derivative having a certain specific structure. Further, JP-A-4-106548 (U.S. Pat. No. 5,219,709) discloses a photopolymerizable composition, of which the polymerization initiating system comprises a squalirium compound having a certain specific structure and a s-triazine compound having a certain specific structure.

However, it is commonly known that with respect to the active radical-forming ability of a photopolymerization initiator, the sensitivity to a light with a wavelength exceeding 500 nm, particularly 600 nm, sharply decreases along with a decrease in the light excitation energy. To a light within such a long wavelength region, none of the conventional photopolymerizable compositions has been satisfactory from the viewpoint of the sensitivity, and in addition, there has been a problem that a photopolymerization reaction is likely to proceed during handling under a white fluorescent lamp, whereby it has been difficult to obtain a product of a uniform quality.

SUMMARY OF THE INVENTION

The present invention has been made in view of the above-described prior art, and it is an object of the present invention to provide a photopolymerizable composition and a photopolymerizable lithographic printing plate, which shows high sensitivity to a light in the visible light region or in a long wavelength region such as a near infrared region and which is insensitive to a light in the ultraviolet region and excellent in handling under a white fluorescent lamp.

The present inventors have conducted extensive studies to solve the above problems and as a result, have found it possible to accomplish the above object with a photopolymerizable composition containing a cyanine dye of a structure wherein hetero atoms are bonded via a polymethine chain having a certain specific substituent. The present invention has been accomplished on the basis of this discovery.

Namely, the present invention provides a photopolymerizable composition comprising (A) an ethylenically unsaturated compound, (B) a cyanine dye and (C) a photopolymerization initiator, wherein the cyanine dye of component (B) is a cyanine dye of a structure having hetero atoms connected via a polymethine chain, and the polymethine chain has at least one substituent of the following formula ($\alpha$):

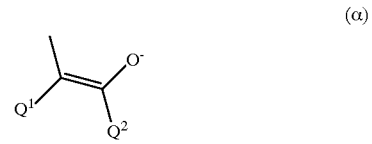

wherein $Q^1$ and $Q^2$ are optional substituents, which may be connected to form a ring.

The present invention also provides a photopolymerizable lithographic printing plate comprising a support and a layer of said photopolymerizable composition formed on the surface of the support.

Further, the present invention provides a process for forming an image, which comprising exposing the above mentioned photopolymerizable lithographic printing plate with a light of from 700 to 1,300 nm, followed by development with an alkali developer.

DETAILED DESCRIPTION OF THE PREFERRED EMBODIMENTS

The ethylenically unsaturated compound of component (A) constituting the photopolymerizable composition of the present invention, is a monomer having an ethylenically unsaturated double bond which undergoes addition polymerization and, in some cases, undergoes crosslinking or curing, by an action of the photopolymerization initiator of component (C) which will be described hereinafter, when the photopolymerizable composition is irradiated with active light rays, or a polymer having such double bonds in its main chain or side chain. Here, the monomer is meant for a concept opposite to a so-called polymer, and it includes in addition to a monomer in a narrow sense, a dimer, a trimer and other oligomers.

Specifically, such monomers include, for example, (1) unsaturated carboxylic acids such as acrylic acid and methacrylic acid (these two acids may generally be referred to as "(meth)acrylic acid"), (2) alkyl esters of these acids, (3) esters of unsaturated carboxylic acids with aliphatic polyhydroxy compounds, such as ethylene glycol di(meth) acrylate, diethylene glycol di(meth)acrylate, triethylene glycol di(meth)acrylate, trimethylol ethane tri(meth)acrylate, trimethylol propane tri(meth)acrylate, pentaerythritol di(meth)acrylate, pentaerythritol tri(meth)acrylate, pentaerythritol tetra(meth)acrylate, dipentaerythritol tetra(meth) acrylate, dipentaerythritol penta(meth)acrylate, dipentaerythritol hexa(meth)acrylate, glycerol di(meth)acrylate, glycerol tri(meth)acrylate, and the corresponding itaconates, crotonates and maleates, (4) esters of unsaturated carboxylic acids with aromatic polyhydroxy compounds, such as hydroquinone di(meth)acrylate, resorcinol di(meth)acrylate, and pyrogallol tri(meth)acrylate, (5) condensates of polyhydroxy compounds, unsaturated carboxylic acids and polybasic carboxylic acids, such as a condensate of ethylene glycol, (meth)acrylic acid and phthalic acid, a condensate of diethylene glycol, (meth)acrylic acid and maleic acid, a condensate of pentaerythritol, (meth)acrylic acid and terephthalic acid, and a condensate of butane diol, glycerol, (meth)acrylic acid and adipic acid, (6) urethane (meth) acrylates, such as an addition reaction product of a polyisocyanate compound such as tolylene diisocyanate, with a hydroxyl group-containing (meth)acrylate such as hydroxyethyl (meth)acrylate, (7) vinyl urethanes, such as an addition reaction product of a polyisocyanate compound with a hydroxyl group-containing vinyl compound, (8) epoxy (meth)acrylates, such as an addition reaction product of a polyvalent epoxy compound with a hydroxyl group-containing (meth)acrylate such as hydroxyethyl (meth) acrylate, (9) acryloamides, such as ethylene bis(meth) acrylamide, (11) vinyl group-containing compounds, such as divinyl phthalate, and (12) (meth)acryloyl group-containing phosphoric acid esters, such as (meth)acryloyloxyethyl phosphate, and bis((meth)acryloyloxyethyl) phosphate.

As the polymers, specifically those having double bonds in their main chains include, for example, (1) polyesters obtained by a condensation reaction of an unsaturated dicarboxylic acid with a dihydroxy compound, and (2) polyamides obtained by a polycondensation reaction of an unsaturated dicarboxylic acid with a diamine compound, and those having double bonds in their side chains, include, for example, (3) polyesters obtained by a polycondensation reaction of itaconic acid, ethylidenemalonic acid or propylidenesuccinic acid, with a dihydroxy compound, (4) polyamides obtained by a polycondensation reaction of itaconic acid, ethylidenemalonic acid or propylidenesuccinic acid, with a diamine compound, and (5) polymers obtained by a reaction of an unsaturated carboxylic acid with a polymer having reactive functional groups such as hydroxyl groups or halogenated methyl groups in its side chain, such as a polyvinyl alcohol, a poly(2-hydroxyethyl methacrylate) or a polyepichlorohydrin.

The cyanine dye of component (B) constituting the photopolymerizable composition of the present invention, is a cyanine dye of a structure having hetero atoms connected via a polymethine chain, and the polymethine chain has at least one substituent of the formula (α):

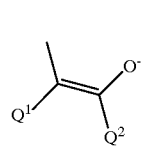

(α)

wherein $Q^1$ and $Q^2$ are optional substituents, which may be connected to form a ring. Particularly effective is a near infrared absorbing dye having an absorption band over the entirety or a part of the near infrared region with a wavelength range of from 700 to 1,300 nm. Such a near infrared absorbing dye is a compound which has a sensitizing function such that it efficiently absorbs a light within the above wavelength range and conducts the light excitation energy to the photopolymerization initiator of component (C) which will be described hereinafter, to decompose the photopolymerization initiator and to form active radicals which induce polymerization of the above mentioned ethylenically unsaturated compound of component (A) and which, on the other hand, absorbs no substantial light in the ultraviolet region, or even if it absorbs such a light, it is substantially insensitive and thus has no action to modify the composition by such weak ultraviolet rays as contained in a white fluorescent lamp.

Now, the substituent (α) of the above cyanine dye will be described. Preferably, each of $Q^1$ and $Q^2$ which are independent of each other, is a hydrocarbon group which may have a substituent, an amino group which may have a substituent, a (thio)ether group which may have a substituent, a cyano group, a (thio)acyl group which may have a substituent, an alkoxycarbonyl group which may have a substituent, a (thio)amide group which may have a substituent, or an imino group, or $Q^1$ and $Q^2$ may be connected to each other directly or via a connecting group, to form a ring structure. Here, the (thio)carbonyl group means a carbonyl group or a thiocarbonyl group, the (thio) acyl group means an acyl group or a thioacyl group, and the (thio)amide group means an amide group or a thioamide group.

In the above definition, the hydrocarbon group is preferably a $C_{1-10}$ alkyl group or a $C_{6-10}$ aryl group. The substituent which the hydrocarbon group, the amino group, the (thio)ether group, the (thio)acyl group, the (thio)amide group or the alkoxycarbonyl group, may have, may, for example, be a $C_{1-10}$ alkyl group or a $C_{6-10}$ aryl group.

$Q^1$ is particularly preferably a group having an electron attractive group, particularly a carbonyl group, such as a (thio)acyl group which may have a substituent, an alkoxycarbonyl group which may have a substituent, or a (thio) amide group which may have a substituent. $Q^2$ is preferably an electron donative group, such as an amino group which may have a substituent or a (thio)ether group which may have a substituent, provided that $Q^1$ and $Q^2$ may be connected directly or via a connecting group.

Particularly preferably, the above substituent (α) is a group wherein $Q^1$ and $Q^2$ are the above-mentioned preferred groups, and they are connected to form a heterocyclic structure. Specifically, such preferred groups include the following:

(α-1)
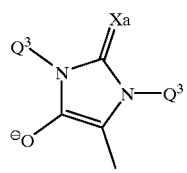

(α-2)
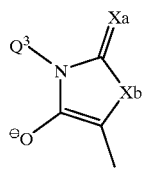

(α-3)
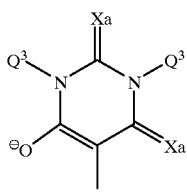

(α-4)
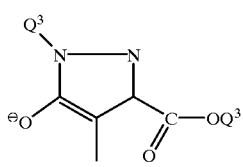

(α-5)
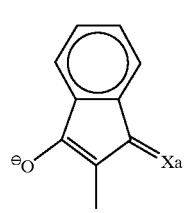

(α-6)
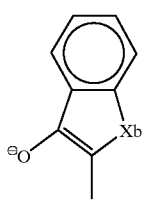

(α-7)
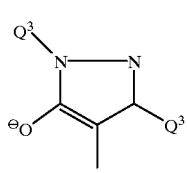

In the above Formulae, each of $X_a$ and $X_b$ which are independent of each other, is a sulfur atom or an oxygen atom, $Q^3$ is an alkyl group which may have a substituent, an alkenyl group which may have a substituent, an alkoxy group which may have a substituent, or an aryl group which may have a substituent, and when a plurality of $Q^3$ are present, they may be the same or different from one another.

Among the above, particularly preferred is the group having a barbituric acid structure or a thiobarbituric acid structure, i.e. the group of the formula (a-3). Preferably, $Q^3$ is a $C_{1-10}$ alkyl group or a $C_{6-10}$ aryl group.

In the present invention, the barbituric anion group or the thiobarbituric anion group particularly preferred as the substituent on the polymethine chain in the above cyanine dye of component (B), may be one represented by the following Formula (V):

(V)

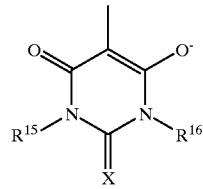

wherein X is an oxygen atom or a sulfur atom, and each of $R^{15}$ and $R^{16}$ which are independent of each other, is a hydrogen atom, an alkyl group which may have a substituent, an alkenyl group which may have a substituent, an alkoxy group which may have a substituent, or a phenyl group which may have a substituent.

Here, each of $R^{15}$ and $R^{16}$ in the Formula (V) is preferably an alkyl group. Specifically, the alkyl group may be a $C_{1-10}$ alkyl group, particularly $C_{1-6}$ alkyl group, such as a methyl group, an ethyl group, a propyl group or a butyl group.

In the present invention, the cyanine dye having the above substituent (α) is a so-called cyanine dye in a broad sense, having hetero atoms such as nitrogen atoms, oxygen atoms or sulfur atoms, connected by a polymethine $(—CH=)_n$ chain. Specifically, it may, for example, be a quinoline type (so-called cyanine type), an indole type (so-called indocyanine type), a benzothiazole type (so-called thiocyanine type), an iminocyclohexadiene type (so-called polymethine type), a pyrylium type, a thiapyrylium type, a squalium type, a croconium type or an azulenium type. Among them, preferred is a cyanine dye having heterocyclic rings containing nitrogen atoms, oxygen atoms or sulfur atoms, connected by a polymethine$(—CH=)_n$ chain, or an iminocyclohexadiene type, and particularly preferred is a quinoline type, an indole type, a benzothiazole type, an iminocyclohexadiene type, a pyrylium type or a thiapyrylium type.

In the present invention, among the above cyanine dyes, the quinoline type dye is preferably one represented by the following Formula (Ia), (Ib) or (Ic).

(Ia)

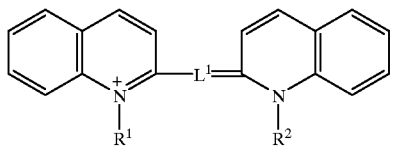

(Ib)

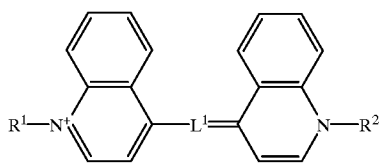

-continued

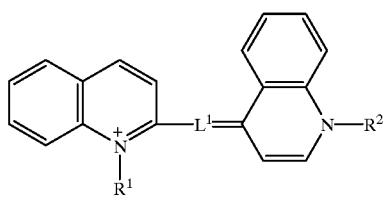
(Ic)

In the Formulae (Ia), (Ib) and (Ic), each of $R^1$ and $R^2$ which are independent of each other, is an alkyl group which may have a substituent, an alkenyl group which may have a substituent, an alkynyl group which may have a substituent, or a phenyl group which may have a substituent, $L^1$ is a tri-, penta-, hepta-, nona- or undeca-methine group having the above mentioned substituent (α), two substituents on the penta-, hepta-, nona- or undeca-methine group, may be connected to each other to form a cyclic structure and the quinoline ring may have at least one substituent, and in such a case, adjacent two substituents may be connected to each other to form condensed benzene ring.

Here, the substituent which each group for each of $R^1$ and $R^2$ in the formulae (Ia), (Ib) and (Ic), may have, may, for example, be an alkoxy group, a phenoxy group, a hydroxyl group or a phenyl group, and the substituent other than the above substituent (α) in $L^1$ may, for example, be an alkyl group, an amino group or a halogen atom, and the substituent on the quinoline ring may, for example, be an alkyl group, an alkoxy group, a nitro group or a halogen atom.

Further, as the indole type or benzothiazole type dye, one represented by the following Formula (II) is particularly preferred.

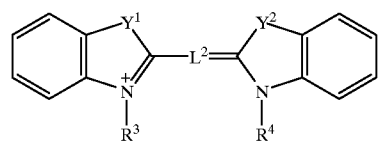
(II)

In the Formula (II), each of $Y^1$ and $Y^2$ which are independent of each other, is a the alkylmethylene group or a sulfur atom, each of $R^3$ and $R^4$ which are independent of each other, is an alkyl group which may have a substituent, an alkenyl group which may have a substituent, an alkynyl group which may have a substituent, or a phenyl group which may have a substituent, $L^2$ is a tri-, penta-, hepta-, nona- or undeca-methine group having the above substituent (α), two substituents on the penta-, hepta-, nona- or undeca-methine group, may be connected to each other to form a cyclic structure and the condensed benzene ring may have at least one substituent, and in such a case, adjacent two substituents may be connected to each other to form a condensed benzene ring.

Here, the substituent which each group for each of $R^3$ and $R^4$ in the Formula (II) may have, may, for example, be an alkoxy group, a phenoxy group, a hydroxyl group or a phenyl group, the substituent other than the above substituent (α) in $L^2$ may, for example, be an alkyl group, an amino group or a halogen atom, and the substituent on the benzene ring may, for example, be an alkyl group, an alkoxy group, a nitro group or a halogen atom.

The linking group $L^2$ is preferably a hepta-, nona- or undeca-methine group. Especially when a laser of from 750 to 850 nm, especially 830 nm, is used as the exposure source, a heptamethine group is particularly preferred.

Further, as the iminocyclohexadiene type dye, one represented by the following Formula (III) is particularly preferred.

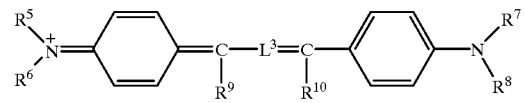
(III)

In the Formula (III), each of $R^5$, $R^6$, $R^7$ and $R^8$ which are independent of one another, is an alkyl group, each of $R^9$ and $R^{10}$ which are independent of each other, is an aryl group, a furyl group or a thienyl group, which may have a substituent, and $L^3$ is a mono-, tri-, penta- or hepta-methine group having the above substituent (α), two substituents on the tri-, penta- or hepta-methine group may be connected to each other to form a cyclic structure and the quinone ring and the benzene ring may have substituents.

Here, each of $R^9$ and $R^{10}$ in the Formula (III) may specifically be, for example, a phenyl group, a 1-naphtyl group, a 2-naphtyl group, a 2-furyl group, a 3-furyl group, a 2-thienyl group or a 3-thienyl group, and the substituent which such a group may have, may, for example, be an alkyl group, an alkoxy group, a dialkylamino group, a hydroxyl group or a halogen atom, and the substituent other than the above mentioned substituent (α) in $L^3$, may, for example, be an alkyl group, an amino group or a halogen atom.

Further, as the pyrylium type or thiapyrylium type dye, one represented by the following Formula (IVa), (IVb) or (IVc) is particularly preferred.

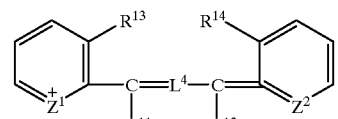
(IVa)

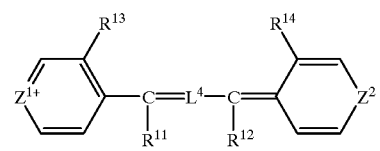
(IVb)

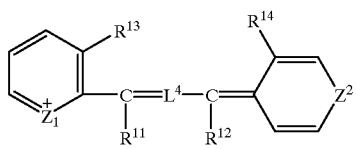
(IVc)

In the Formulae (IVa), (IVb) and (IVc), each of $Z^1$ and $Z^2$ which are independent of each other, is an oxygen atom or sulfur atom, each of $R^{11}$, $R^{12}$, $R^{13}$ and $R^{14}$ which are independent of one another, is a hydrogen atom or an alkyl group, or $R^{11}$ and $R^{13}$, or $R^{12}$ and $R^{14}$, may be connected to each other to form a $C_5$ or $C_6$ cycloalkene ring, $L^4$ is a mono-, tri-, penta- or hepta-methine group having the above substituent (α), two substituents on the tri-, penta- or hepta-methine group, may be connected to each other to form a cyclic structure and the pyrylium ring and the thiapyrylium ring may have substituents, and in such a case, two adjacent substituents may be connected to each other to form a condensed benzene ring.

Here, the substituent other than the above substituent (α) in $L^4$ in the Formulae (IVa), (IVb) and (IVc), may, for example, be an alkyl group, an amino group or a halogen atom, and the substituents on the pyrylium ring and the thiapyrylium ring, may, for example, be aryl groups such as a phenyl group or a naphtyl group.

In the above, the carbon number of the alkyl or alkoxy group is usually from 1 to 10, preferably from 1 to 6, and the carbon number of the alkenyl or alkynyl group is usually from 2 to 10, preferably from 2 to 6. The carbon number of the aryl group is usually from 6 to 12, and preferably, the aryl group is phenyl.

In a case where two substituents on the polymethine group for L in each of the above formulae (Ia) to (Ic), (II), (III), and (IVa) to (IVc) are connected to each other to form a cyclic structure, such a cyclic structure may, for example, be a $C_{5-7}$ cycloalkene, cycloalkenone, cycloalkendione or cycloalkenthione ring.

In the present invention, the indole type or benzothiazole type dye represented by the above Formula (II) is particularly preferred among the foregoing dyes including the indole type or benzothiazole type dye of the above Formula (II), the iminocyclohexadiene type dye of the above Formula (III) and the pyrylium type or thiapyrylium type dye of the above Formulae (IVa to IVc).

Now, specific examples of the above mentioned respective cyanine dyes will be shown below. In the specific examples, A represents the above mentioned substituent (α), specifically, a barbituric anion group or a thiobarbituric anion group.

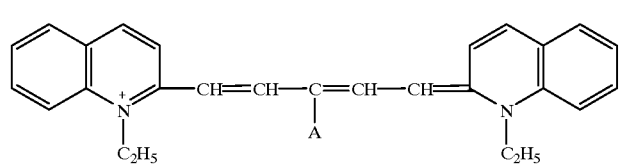

(I-1)

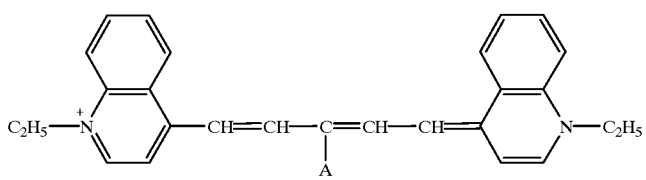

(I-2)

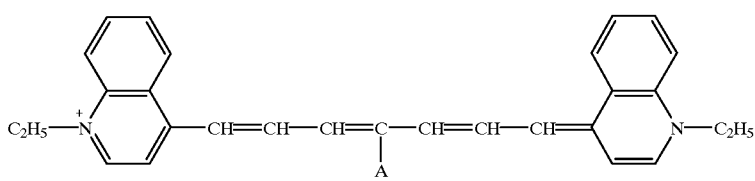

(I-3)

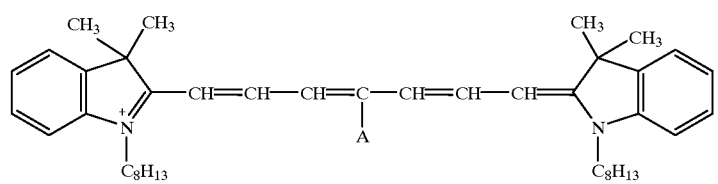

(II-1)

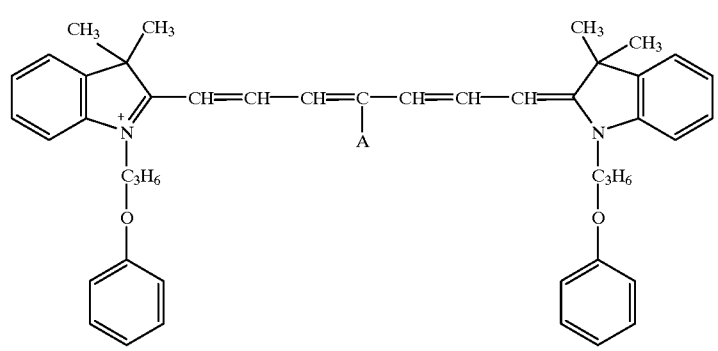

(II-2)

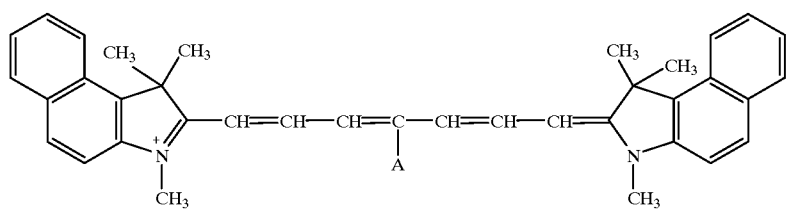
(II-3)
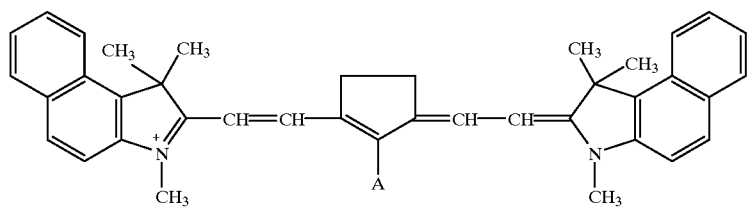
(II-4)
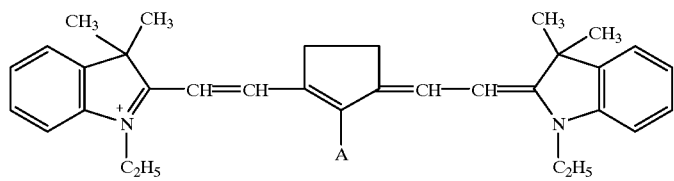
(II-5)
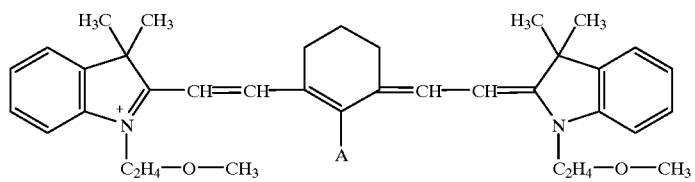
(II-6)
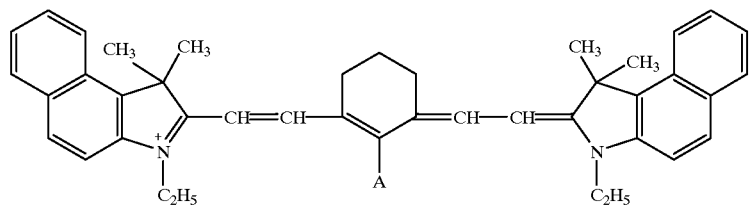
(II-7)
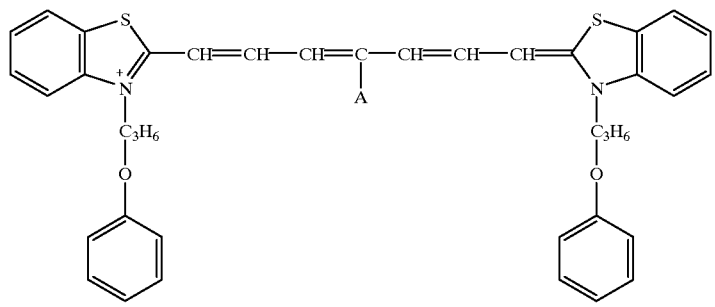
(II-8)
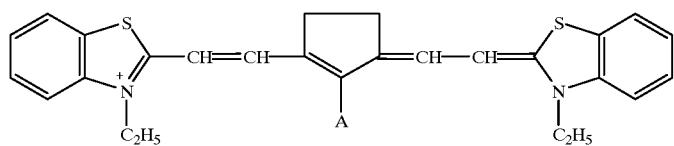
(II-9)

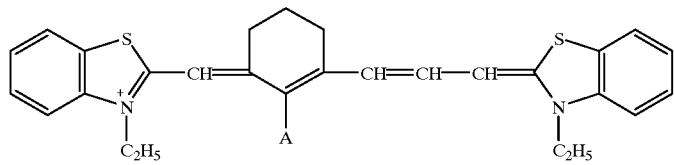
(II-10)
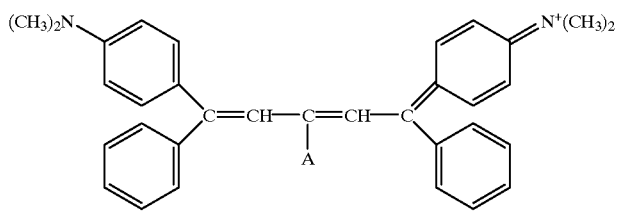
(III-1)
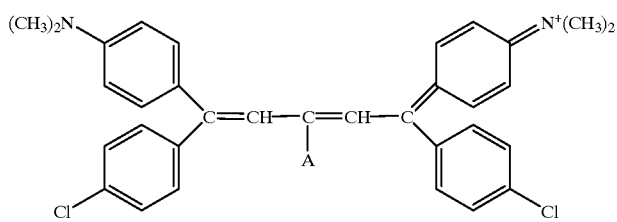
(III-2)
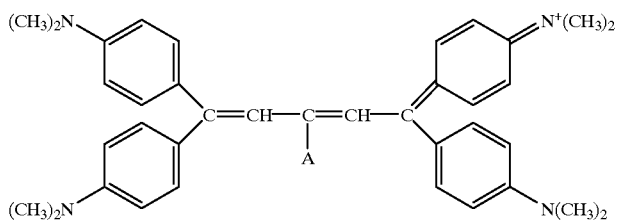
(III-3)
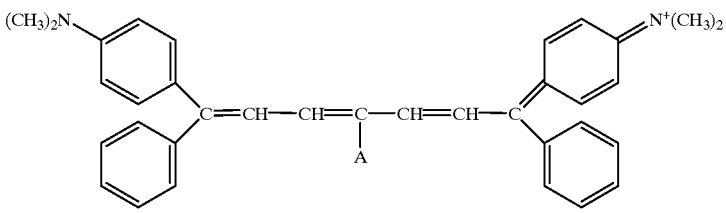
(III-4)
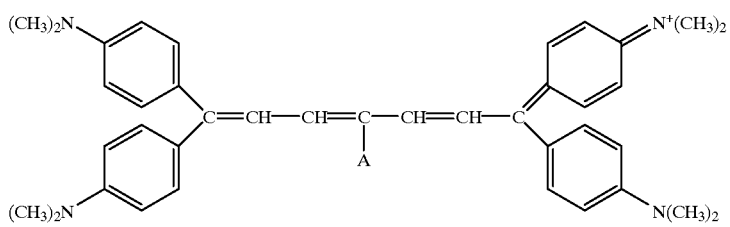
(III-5)
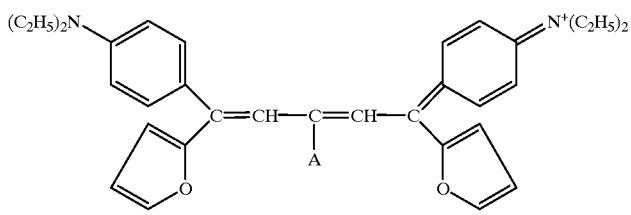
(III-6)

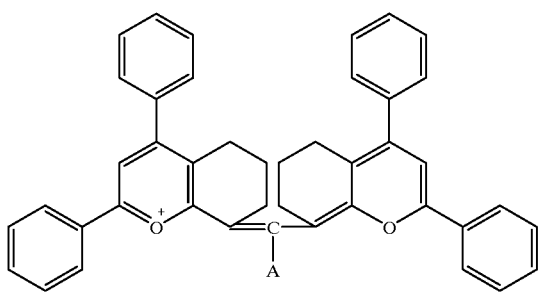
(IV-1)
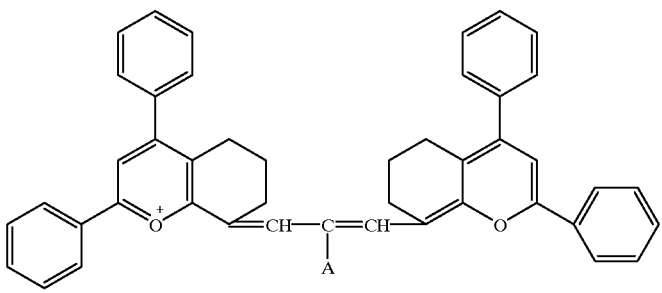
(IV-2)
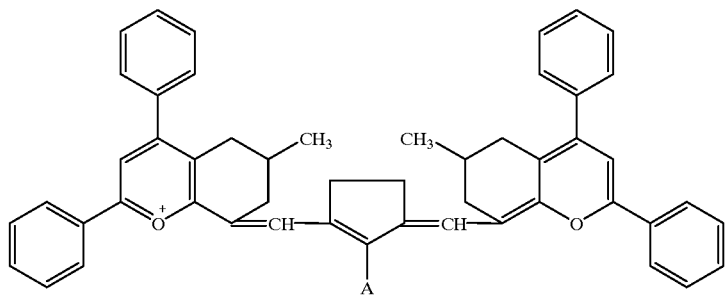
(IV-3)
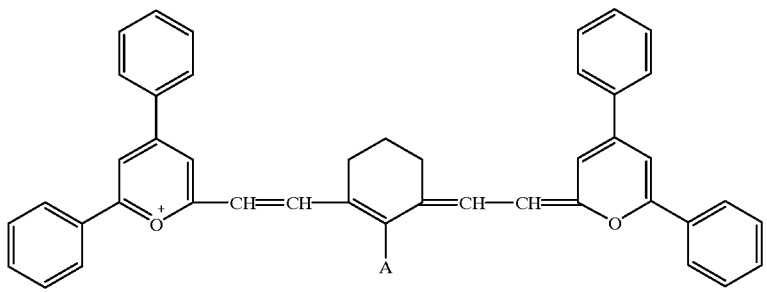
(IV-4)
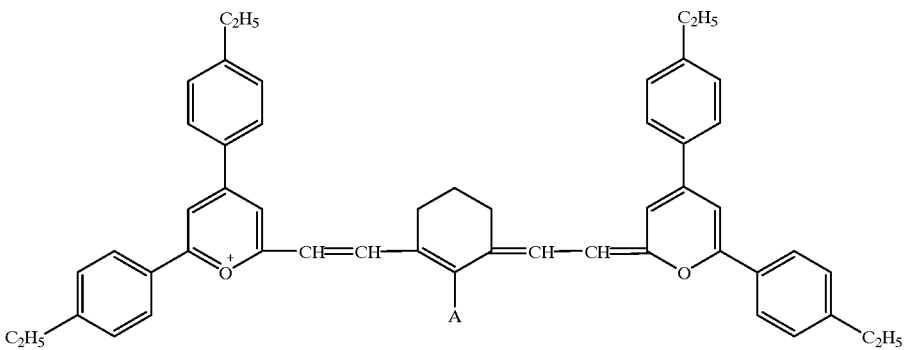
(IV-5)

-continued
(IV-6)
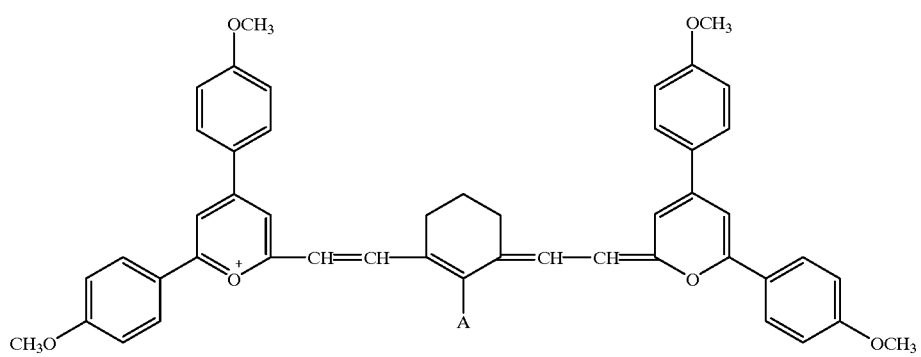
(IV-7)
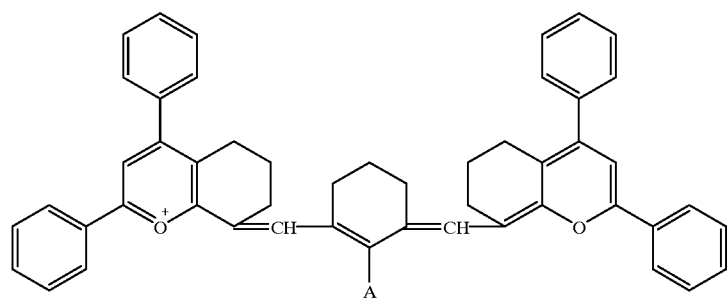
(IV-8)
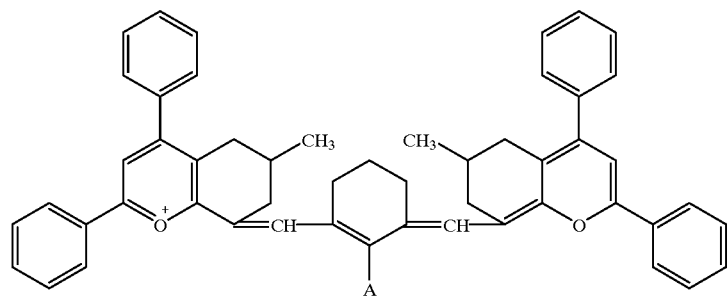
(IV-9)
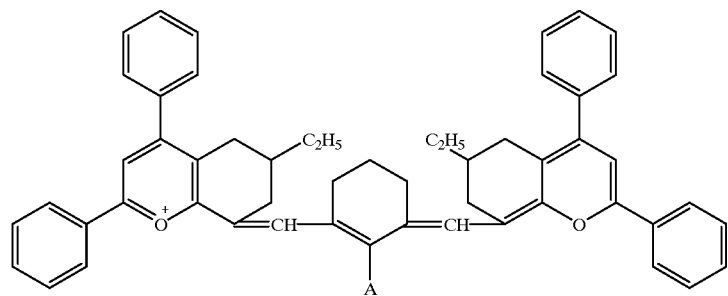

(IV-10)
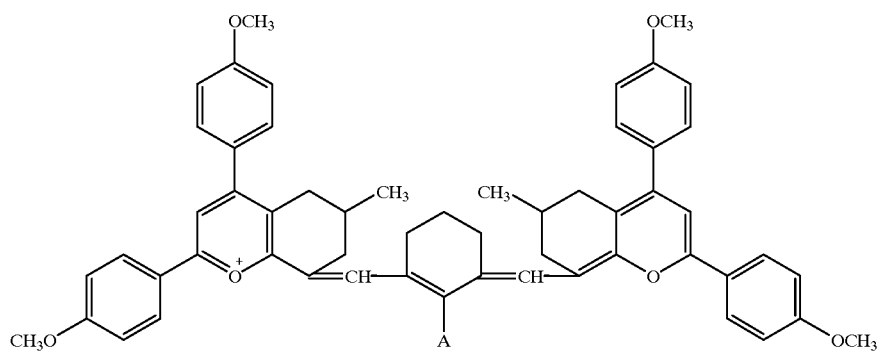
(IV-11)
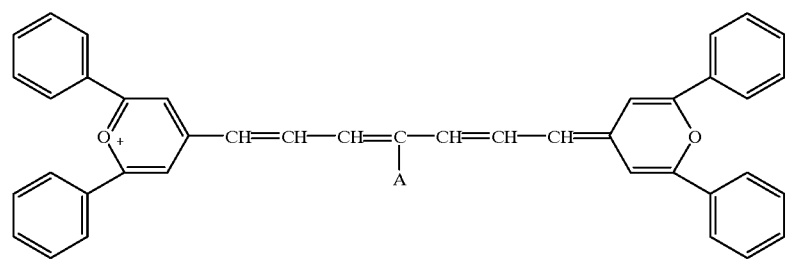
(IV-12)
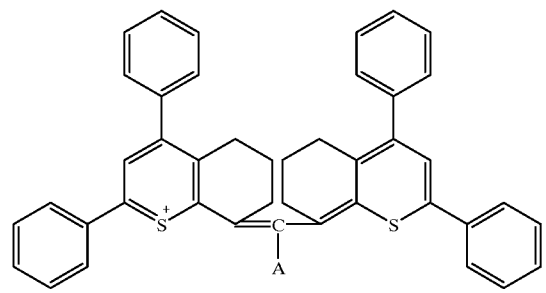
(IV-13)
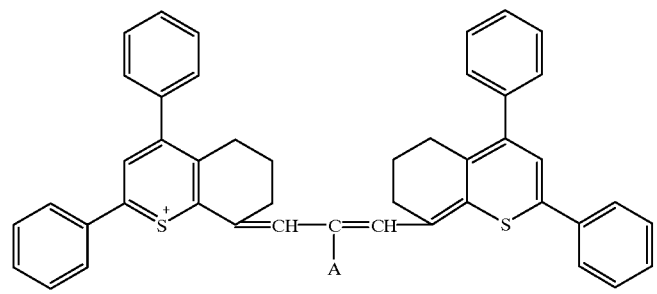
(IV-14)
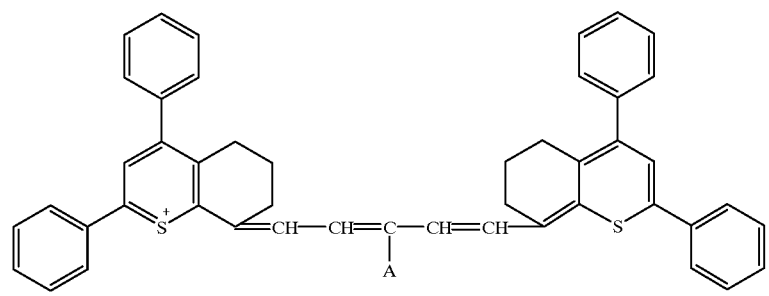

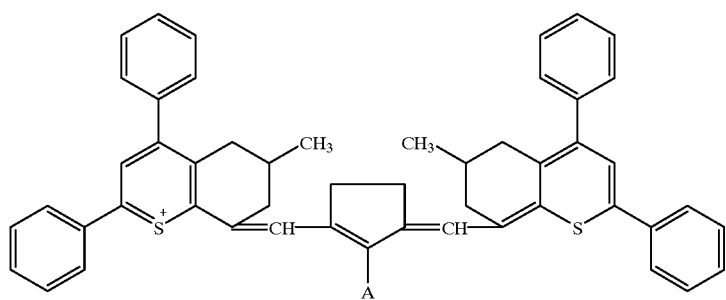
(IV-15)
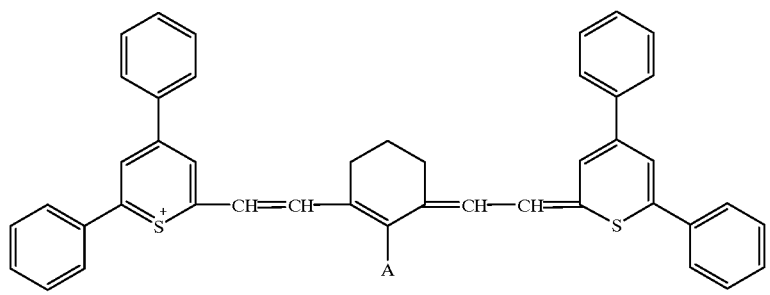
(IV-16)
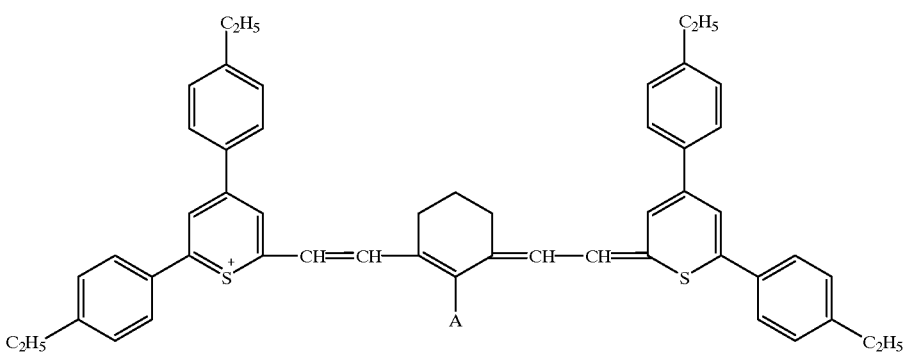
(IV-17)
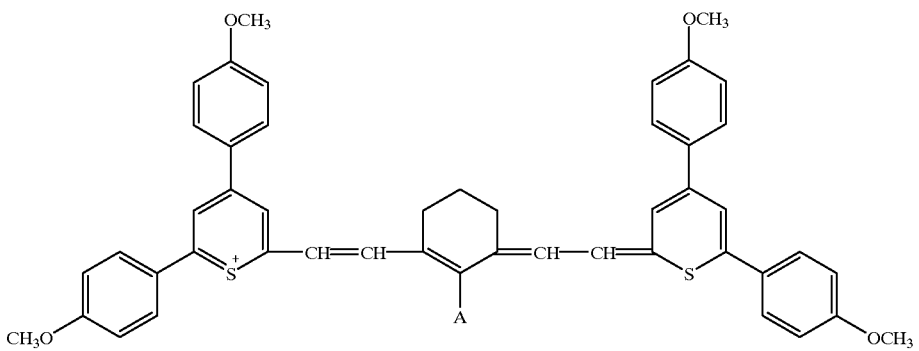
(IV-18)

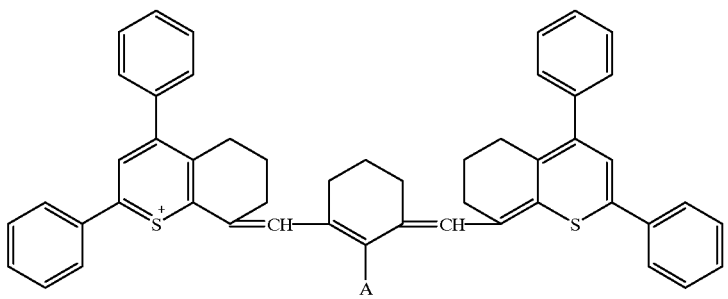

(IV-19)

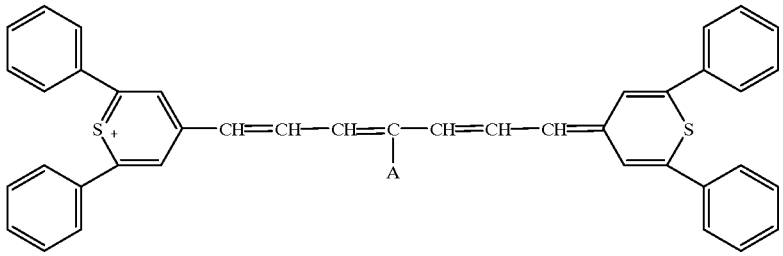

(IV-20)

The cyanine dye of component (B) in the present invention can be synthesized by a method as disclosed in e.g. JP-A-8-67866, Belgium Patent No. 560805 or Dyes and Pigments, 38, 97 (1998). Specifically, it can be synthesized, for example, by a reaction of a near infrared absorbing dye of a structure having heterocyclic rings connected via a linear polymethine chain having a carbonyl group or a polymethine chain forming a cyclopentenone ring, with barbituric acid or thiobarbituric acid, or by a reaction of 1-methyl-benzothiazolidene aldehyde with propylidene barbituric acid or propylidene thiobarbituric acid or with cyclopentylidene barbituric acid or cyclopentylidene thiobarbituric acid.

The photopolymerizable composition of the present invention may contain, in addition to the above mentioned cyanine dye of component (B) having the substituent (α) on the polymethine chain, a cyanine dye which does not have the substituent (α) on the polymethine chain. Such a cyanine dye may, for example, be one having the above mentioned Formula (Ia to Ic), (II), (III) or (IVa to IVc), wherein $L^1$, $L^2$, $L^3$ or $L^4$ is a polymethine chain which does not have the above substituent (α) and which has, as a counter anion, an inorganic acid anion such as $Cl^-$, $Br^-$, $I^-$, $ClO_4^-$, $PF_6^-$ or of an inorganic boric acid such as $BF_4^-$ or $BCl_4^-$, or an organic acid anion of e.g. benzenesulfonic acid, p-toluene sulfonic acid, naphthalene sulfonic acid, acetic acid or an organic boric acid having an organic group such as methyl, ethyl, propyl, butyl, phenyl, methoxyphenyl, naphtyl, difluorophenyl, pentafluorophenyl, thienyl or pyrrolyl.

The photopolymerization initiator of component (C) constituting the photopolymerizable composition of the present invention is a radical-forming agent which forms active radicals when irradiated with a light in the coexistence of the above mentioned cyanine dye of component (B), and it may, for example, be a halogenated hydrocarbon derivative, a titanocene compound disclosed, for example, in JP-A-59-152396 or JP-A-61-151197, a hexaarylbiimidazole compound disclosed, for example, in JP-B-6-29285, a borate disclosed, for example, in JP-A-62-143044, a diaryliodonium salt or an inorganic peroxide. In the present invention, the halogenated hydrocarbon derivative is particularly preferred.

Here, the halogenated hydrocarbon derivative is preferably a s-triazine derivative having at least one mono-, di- or tri-halogenated methyl group bonded to a s-triazine ring, such as 2,4,6-tris(monochloromethyl)-s-triazine, 2,4,6-tris (dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α, α, β-trichloroethyl)-4,6-bis(trichloromethyl)-s-triazine, 2-phenyl-4,6-bis(trichloromethyl)-s-triazine, 2-(p-methoxyphenyl)- 4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tryl)-4,6-bis(trichloromethyl)-s-triazine, 2-(4-methoxynaphtyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris (dibromomethyl)-s-triazine, 2,4,6-tris(tribromomethyl)-s-triazine, 2-methyl-4,6-bis(tribromomethyl)-s-triazine, or 2-methoxy-4,6-bis(tribromomethyl)-s-triazine. Among them, a bis(trihalomethyl)-s-triazine compound such as 2-methyl-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis (trichloromethyl)-s-triazine, 2-[1-(p-methoxyphenyl)-2,4-butadienyl]-4,6-bis(trichloromethyl)-s-triazine, 2-(p-methoxystyryl)-4,6-bis(trichloromethyl)-s-triazine or 2-(p-i-propyloxystyryl)-4,6-bis(trichloromethyl)-s-triazine, is particularly preferred as it is excellent in stability with time.

Other halogenated hydrocarbon derivatives may, for example, be those disclosed in JP-A-53-133428, JP-A-62-58241, German Patent No. 3,337,024, and M. P. Hutt, E. F. Flslager, L. M. Werbel, Journal of Heterocyclic Chemistry, Vol. 7, No. 3 (1970).

The photopolymerizable composition of the present invention comprises the above mentioned ethylenically unsaturated compound of component (A), the above mentioned cyanine dye of component (B) and the above mentioned photopolymerization initiator of component (C), wherein the proportion of component (A) in the entire photopolymerizable composition is preferably from 20 to 80 wt %, more preferably from 30 to 70 wt %, due also to incorporation of other components which will be described hereinafter. The total amount of components (B) and (C) is preferably from 0.1 to 30 parts by weight, more preferably from 0.5 to 20 parts by weight, per 100 parts by weight of component (A).

With respect to the proportions of components (B) and (C), the weight ratio of (B):(C) is preferably within a range of from 1:20 to 10:1, more preferably within a range of from 1:8 to 4:1.

The photopolymerizable composition of the present invention preferably contains, in addition to the above described components, a homopolymer or a copolymer of e.g. (meth)acrylic acid, a (meth)acrylate, (meth)acrylonitrile, (meth)acryloamide, maleic acid, styrene, vinyl acetate, vinyl chloride or maleimide, or an organic polymer substance such as a polyamide, a polyester, a polyether, a polyurethane, a polyvinylbutyral, a polyvinylpyrrolidone, a polyethyleneoxide or an acetyl cellulose, as a binder, in an amount within a range of from 10 to 500 parts by weight, particularly from 20 to 200 parts by weight, per 100 parts by weight of the ethylenically unsaturated compound of component (A).

The weight average molecular weight (Mw) of such an organic polymer substance is usually from 1,000 to 1,000,000, preferably from 10,000 to 500,000. The organic polymer substance is preferably an alkali-soluble resin from the viewpoint of alkali developability. Particularly preferred is a (meth)acrylic resin comprising (meth)acrylic acid and a (meth)acrylate as copolymer components.

Further, various additives may be incorporated, as the case requires, for example, a thermal polymerization-preventing agent such as hydroquinone, p-methoxyphenol or 2,6-di-t-butyl-p-cresol, in an amount of at most 2 parts by weight, a colorant made of an organic or inorganic dye or pigment, in an amount of at most 50 parts by weight, a plasticizer such as dioctyl phthalate, didodecyl phthalate, tricresyl phosphate, dioctyl adipate or triethylene glycol dicaprylate, in an amount of at most 40 parts by weight, a sensitivity-improver such as a tertiary amine or thiol in an amount of at most 5 parts by weight, and a colorant precursor such as a triaryl methane, a bisaryl methane, a xanthene compound, a fluoran compound, a thiazine compound or a colorant leuco compound such as a compound having a lactone, lactam, sultone or spiropyran structure formed as its partial structure, in an amount of at most 10 parts by weight.

When the photopolymerizable composition of the present invention is used as a photosensitive material, it may take a suitable mode of application depending upon the particular purpose, for example, a mode such that it is coated on a support surface in the absence of a solvent or after diluted with a suitable solvent, and dried, or a mode such that an overcoating layer for shielding oxygen is further formed thereon, or a mode such that it is dispersed in small droplets in different phase media and coated in the form of multi layers as a plurality of photosensitive materials, or a mode such that it is coated on a support as encapsulated in microcapsules. The polymerizable composition of the present invention is preferably used in the form of a photopolymerizable lithographic printing plate prepared in such a manner that the composition is coated on a support surface in the form of a solution having the composition dissolved in a suitable solvent, followed by heating and drying to form a layer of the photopolymerizable composition of the present invention on the support surface.

Here, the solvent is not particularly limited so long as it provides sufficient solubility for the components used and it provides a good film-forming property. It may, for example, be a cellosolve type solvent such as methyl cellosolve, ethyl cellosolve, methyl cellosolve acetate or ethyl cellosolve acetate, a propylene glycol type solvent such as propylene glycol monomethyl ether, propylene glycol monoethyl ether, propylene glycol monobutyl ether, propylene glycol monomethyl ether acetate, propylene glycol monoethyl ether acetate, propylene glycol monobutyl ether acetate or dipropylene glycol dimethyl ether, an ester type solvent such as butyl acetate, amyl acetate, ethyl lactate, butyl lactate, diethyl oxalate, ethyl pyruvate, ethyl 2-hydroxy butyrate, ethyl acetate, methyl lactate, ethyl lactate or methyl 3-methoxy propionate, an alcohol type solvent such as heptanol, hexanol, diacetone alcohol or furfuryl alcohol, a ketone type solvent such as cyclohexanone or methyl amyl ketone, a highly polar solvent such as dimethylformamide, dimethylacetoamide or N-methylpyrrolidone, or a mixed solvent thereof. Further, one having an aromatic hydrocarbon added thereto, may be mentioned. The amount of the solvent is usually within a range of from 1 to 20 times by weight, based on the total amount of the photopolymerizable composition.

As the coating method, a conventional method such as rotation coating, wire bar coating, dip coating, air knife coating, roll coating, blade coating or curtain coating, may be employed. The amount of coating varies depending upon the particular purpose, but it is usually within a range of from 0.3 to 7 μm, preferably from 0.5 to 5 μm, more preferably from 1 to 3 μm, as a dried film thickness. The drying temperature at that time is, for example, at a level of from 60 to 170° C., preferably from 70 to 150° C., and the drying time is usually from 5 seconds to 10 minutes, preferably from 10 seconds to 5 minutes.

Further, it is common to provide an oxygen-shielding layer of e.g. polyvinylalcohol, polyvinylpyrrolidone, polyethyleneoxide or cellulose, on the above layer of the photopolymerizable composition, in order to prevent the polymerization inhibiting action by oxygen. The thickness of the oxygen-shielding layer is usually from 0.5 to 5 μm.

As the support, a metal plate of e.g. aluminum, zinc, copper or steel, a metal plate having aluminum, zinc, copper, iron, chromium or nickel plated or vapor-deposited thereon, a paper sheet, a paper sheet coated with a resin, a paper sheet having a metal foil such as an aluminum foil bonded thereto, a plastic film, a plastic film treated by hydrophilic treatment, or a glass plate, may, for example, be mentioned. Among them, preferred is an aluminum plate, and more preferred is an aluminum plate subjected to graining treatment by blush polishing or electrolytic etching in a hydrochloric acid or nitric acid solution, anodic oxidation treatment in a sulfuric acid solution and, if necessary, surface treatment such as sealing treatment. The thickness of the support is usually from 1.5 to 3 mm. Further, the surface roughness of the support is usually from 0.3 to 1.0 μm, preferably from 0.4 to 0.8 μm, as average roughness $R_a$ as stipulated by JIS B0601.

A light source for image exposure of the photopolymerizable composition layer of the lithographic if printing plate of the present invention, may, for example, be a carbon arc, a high pressure mercury lamp, a xenon lamp, a metal halide lamp, a fluorescent lamp, a tungsten lamp, a halogen lamp, or a laser light source such as a HeNe laser, an argon ion laser, a YAG laser, a HeCd laser, a semiconductor laser, or a ruby laser. Particularly preferred is a light source which is capable of generating a laser beam ranging from a visible light ray of at least 600 nm to a near infrared ray, and a solid laser such as a ruby laser, a YAG laser or a semiconductor laser, may be mentioned. Especially, a semiconductor laser or a YAG laser of a small size having a long useful life, is preferred. By such a light source, scanning exposure is usually conducted, followed by development with a developer, whereby an image will be formed.

When exposed with a high density light intensity of at least $10^8$ W/m$^2$ by a light within a range of a near infrared region of from 700 to 1,300 nm, by means of e.g. a semiconductor laser capable of generating a laser beam within a wavelength range of from 700 to 1,300 nm, the photopolymerizable composition of the present invention shows a sensitivity of at lest 5 times, preferably at least 10 times, as compared with a case where it is exposed with a low density light intensity of at most $10^2$ W/m$^2$, and due to the difference in this sensitivity, it is capable of providing a safe light property (a workability) under a usual white fluorescent lamp.

As the developer to be used for developing after the image exposure of the above photopolymerizable lithographic printing plate of the present invention, an alkali developer is employed which is made of an aqueous solution containing from about 0.1 to 5 wt % of an inorganic alkali salt such as sodium silicate, potassium silicate, lithium silicate, ammonium silicate, sodium methasilicate, potassium methasilicate, sodium hydroxide, potassium hydroxide, lithium hydroxide, sodium carbonate, sodium hydrogencarbonate, potassium carbonate, sodium secondary phosphate, sodium tertiary phosphate, ammonium secondary phosphate, ammonium tertiary phosphate, sodium borate, potassium borate or ammonium borate, or an organic amine compound such as monomethyl amine, dimethyl amine, trimethyl amine, monoethyl amine, diethyl amine, triethyl amine, monoisopropyl amine, diisopropyl amine, monobutyl amine, monoethanol amine, diethanol amine, triethanol amine, monoisopropanol amine or diisopropanol amine. Among them, as an inorganic alkali salt, an alkali metal silicate such as sodium silicate or potassium silicate, is preferred.

Now, the present invention will be described in further detail with reference to Examples. However, it should be understood that the present invention is by no means restricted to such specific Examples.

EXAMPLE 1

An aluminum plate (thickness: 0.24 mm) subjected to graining treatment and anodic oxidation treatment, was used as a support, and on the surface of the aluminum plate support, a coating solution prepared by stirring 100 parts by weight of trimethylolpropane triacrylate as component (A), 2 parts by weight of a cyanine dye being an indole dye shown in the above specific example (II-4) and having a barbituric anion group of the Formula (V) wherein X is an oxygen atom and each of $R^{15}$ and $R^{16}$ is a methyl group, as component (B), 5 parts by weight of 2-(p-methoxyphenyl)-4,6-bis(trichloromethyl)-s-triazine as component (C), and 100 parts by weight of a methyl methacrylate/methacrylic acid copolymer (molar ratio: 90/10, weight average molecular weight: 450,000) as a polymer binder, in 1,400 parts by weight of methyl cellosolve at room temperature for 10 minutes, was coated by means of a wire bar and dried at 80° C. for 2 minutes, to form a layer of the photopolymerizable composition having a thickness of 2 μm. Further, an aqueous polyvinyl alcohol solution was coated thereon and dried at 80° C. for 2 minutes, to form an overcoating layer having a thickness of 3 μm, to obtain a photopolymerizable lithographic printing plate.

The obtained photopolymerizable lithographic printing plate was secured on an aluminum rotary drum having a diameter of 7 cm so that the layer of the photopolymerizable composition was located outside, and then subjected to scanning exposure at various rotational speeds of from 500 to 1,000 rpm, using a beam spot having a beam of semiconductor laser (manufactured by Applied Techno Company) of 30 mW with 830 nm focussed to 20 μm. Then, development was carried out by means of an alkali developer (negative developer "SDN-21" manufactured by Konica Company, as diluted 9 times), to form a scanning line image. The higher the maximum rotational speed of the exposure drum on which the line image was formed, the higher the sensitivity. In this Example, the maximum rotational speed was 600 rpm.

The exposed portion of the photopolymerizable composition layer underwent a color change to a deep green color, whereby the visible image property was observed.

On the other hand, a photopolymerizable lithographic printing plate left to stand under a white fluorescent lamp with a light intensity 400 lux (36 W white fluorescent lamp "Neolumisuper FLR40S-W/M/36", manufactured by Mitsubishi Electric Company Ltd.) for one hour and a photopolymerizable lithographic printing plate which was not so left to stand, were subjected to developing treatment in the same manner as above, and then, inking was carried out by means of a developing ink ("PI-2", manufactured by Fuji Photographic Film Industries Company Ltd.), whereby no attachment of the ink was observed irrespective of being left to stand or not being left to stand, whereby it was confirmed that there was no difference in the decrease of solubility of the photopolymerizable composition layer due to the white fluorescent lamp.

EXAMPLE 2

A photopolymerizable lithographic printing plate was prepared and developed in the same manner as in Example 1 except that a cyanine dye being an indole type dye shown in the above specific example (II-4) and having a thiobarbituric anion group of the Formula (V) wherein X is a sulfur atom, and each of $R^{15}$ and $R^{16}$ is an ethyl group, was used, whereby the maximum rotational speed of the exposure drum was 600 rpm. The exposed portion of the photopolymerizable composition layer underwent a color change to a deep green color, whereby a visible image property was observed.

EXAMPLE 3

A photopolymerizable lithographic printing plate was prepared and developed in the same manner as in Example 1 except that as component (C), 2-(p-i-propyloxystyryl)-4,6-bis(trichloromethyl)-s-triazine was used, whereby the maximum rotational speed of the exposure drum was 800 rpm. The exposed portion of the photopolymerizable composition layer underwent a color change to a deep green color, whereby a visible image property was observed.

EXAMPLE 4

A photopolymerizable lithographic printing plate was prepared and developed in the same manner as in Example 2 except that as component (C), 2-(p-i-propyloxystyryl)-4,6-bis(trichloromethyl)-s-triazine was used, whereby the maximum rotational speed of the exposure drum was 800 rpm. The exposed portion of the photopolymerizable composition layer underwent a color change to a deep green color, whereby a visible image property was observed.

COMPARATIVE EXAMPLE 1

A photopolymerizable lithographic printing plate was prepared and developed in the same manner as in Example 1 except that as component (B), a cyanine dye which does not have a barbituric anion group or a thiobarbituric anion group in the above specific example (II-3) as a substituent and having $ClO_4^-$ as a counter anion, was used alone, whereby the maximum rotational speed of the exposure drum was not higher than 400 rpm. In the photopolymerizable composition layer, coating defects due to crystal particles of the cyanine dye, were observed, and no color change of the exposed portion was observed.

COMPARATIVE EXAMPLE 2

A photopolymerizable lithographic printing plate was prepared and developed in the same manner as in Example 1 except that as component (B), a cyanine dye which does not have a barbituric anion group or a thiobarbituric anion group in the above specific example (IV-1) and having $ClO_4^-$ as a counter anion, was used alone, whereby the maximum rotational speed of the exposure drum was not higher than 400 rpm. In the photopolymerizable composition layer, coating defects due to crystal particles of the cyanine dye, were observed, and no color change of the exposed portion was observed.

EXAMPLE 5

Production Example 1: Synthesis (1) of organic polymer substance 200 parts by weight of a copolymer (Mw: 70,000, hereinafter referred to as "binder 1") of methyl methacrylate/isobutyl methacrylate/isobutyl acrylate/methacrylic acid= 35/20/10/35 mol % (charged ratio), 75 parts by weight of an alicyclic epoxy-containing unsaturated compound as shown below, 2.5 parts by weight of p-methoxyphenol, 8 parts by weight of tetrabutylammonium chloride and 800 parts by weight of propylene glycol monomethyl ether acetate, were added to a reactor and stirred and reacted at 110° C. for 24 hours in air to obtain a solution of an ethylenic polymer binder (acid value: 60, one having unsaturated groups reacted to 60% of the entire methacrylic acid components of binder 1, hereinafter referred to as "binder 2").

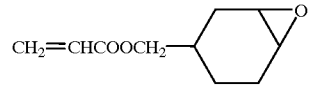

Production Example 2: Synthesis (2) of an organic polymer substance 855 parts by weight of a copolymer ("SCK-690", tradename, manufactured by Johnson Company, acid value: 240, Mw: 15,000) of (α-methyl)styrene/acrylic acid, 490 parts by weight of the same alicyclic epoxy-containing unsaturated compound as used in Production Example 1, 1.3 parts by weight of p-methoxyphenol, 4.3 parts by weight of tetraethylammonium chloride and 1,800 parts by weight of propylene glycol monomethyl ether acetate were added to a reactor and stirred and reacted at 120° C. for 15 hours in air to obtain an ethylenic polymer binder (acid value: about 170, one having unsaturated groups reacted to 50% of the entire acrylic acid components of the copolymer of (a-methyl) styrene/acrylic acid, hereinafter referred to as "binder 3").

A photopolymerizable lithographic printing plate was prepared in the same manner as in Example 1 except that the coating solution of the photopolymerizable composition was changed to the following coating solution (I) of the photopolymerizable composition.

Coating solution (I) of the photopolymerizable composition

Photopolymerization initiator

Cyanine dye having a barbituric anion group of the above specific example (II-4), wherein A represents the above group (V) wherein X is an oxygen atom, and each of

| | |
|---|---|
| $R^{15}$ and $R^{16}$ is a methyl group | 2 parts by weight |
| 2-(p-methoxyphenyl)-4,6-bis(trichloromethyl)-s-triazine | 5 parts by weight |
| Polymer binder | |
| Binder 2 | 35 parts by weight |
| Binder 3 | 10 parts by weight |
| Ethylenically unsaturated compound | |
| 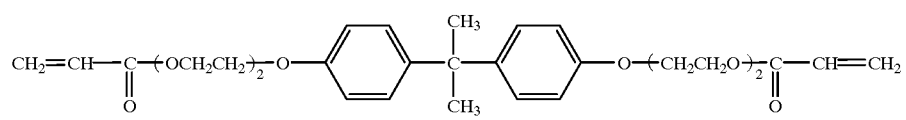 | 23 parts by weight |
| 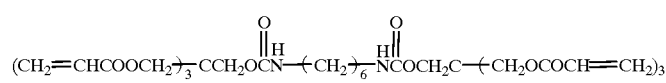 | 22 parts by weight |

-continued

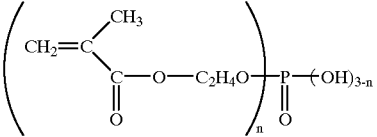
10 parts by weight (a 1:1 mixture of one wherein n = 1 and one wherein n = 2)

| Copper phthalocyanine pigment | 3 parts by weight |
| Cyclohexanone | 100 parts by weight |

By a laser exposure apparatus (Trendsetter 3442 T) manufactured by Creo Company equipped with a near infrared laser of 830 nm, the photopolymerizable lithographic printing plate was subjected to image exposure of a 2 to 98% dot test pattern at an exposure of 200 mJ/cm² with 175 lines and then developed with an aqueous solution containing 0.7 wt % of sodium carbonate and 0.5 wt % of an anionic surfactant (Pelex NBL, manufactured by Kao Corporation), to form an image on an aluminum support, to obtain a lithographic printing plate. The lithographic printing plate was mounted on a shell plate on a printing machine (lithographic printing machine "Dia F-2", manufactured by Mitsubishi Heavy Industries, Co. Ltd.), and 100,000 sheets were printed, whereby a printed product of high quality free from a problem such as defects of small dot images, was obtained even with the 100,000th printed product.

According to the present invention, it is possible to provide a photopolymerizable composition and a photopolymerizable lithographic printing plate, which shows high sensitivity to a light in a visible light region or in a long wavelength region such as a near infrared region and which is insensitive to a light in the ultraviolet region and thus is excellent in the handling efficiency under a white fluorescent lamp, whereby the exposed portion undergoes a color change to provide a visible image property.

Further, the photopolymerizable composition of the present invention is excellent in the solubility in a solvent, whereby it is possible to effectively form a layer of the photopolymerizable composition by coating it on a substrate surface in the form of a solution.

Further, the photopolymerizable lithographic age printing plate having a layer of the photopolymerizable composition of the present invention formed, has a good printing property, whereby a printed product of a high quality free from defects of small dot images, can be obtained.

What is claimed is:

1. A photopolymerizable composition comprising (A) an ethylenically unsaturated compound, (B) a cyanine dye and (C) a photopolymerization initiator, wherein the cyanine dye of component (B) is a cyanine dye of a structure having hetero atoms connected via a polymethine chain, and the polymethine chain has at least one substituent of the following formula (α):

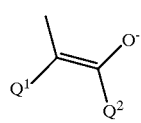

(α)

wherein $Q^1$ and $Q^2$ are optional substituents, which may be connected to form a ring.

2. The photopolymerizable composition according to claim 1, wherein the hetero atoms are oxygen atoms, sulfur atoms or nitrogen atoms.

3. The photopolymerizable composition according to claim 1, wherein in the substituent (α) of the cyanine dye of component (B), $Q^1$ is an electron attractive substituent, and $Q^2$ is an electron donative substituent.

4. The photopolymerizable composition according to claim 3, wherein in the substituent (α) of the cyanine dye of component (B), $Q^1$ is a (thio)acyl group which may have a substituent, an alkoxycarbonyl group which may have a substituent, or a (thio)amide group which may have a substituent, provided that $Q^1$ and $Q^2$ may be connected directly or via a connecting group, and $Q^2$ is an amino group which may have a substituent, or a (thio)ether group which may have a substituent.

5. The photopolymerizable composition according to claim 1, wherein the substituent (α) of the cyanine dye of component (B) is a barbituric group or a thiobarbituric group.

6. The photopolymerizable composition according to claim 5, wherein the barbituric group or the thiobarbituric group is one represented by the following Formula (V):

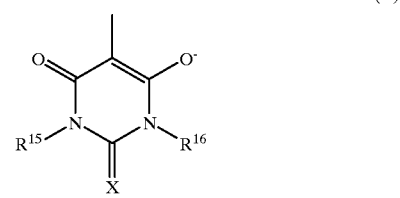

(V)

wherein X is an oxygen atom or a sulfur atom, and each of $R^{15}$ and $R^{16}$ which are independent of each other, is a hydrogen atom, an alkyl group which may have a substituent, an alkenyl group which may have a substituent, an alkoxy group which may have a substituent, or a phenyl group which may have a substituent.

7. The photopolymerizable composition according to claim 6, wherein in the Formula (V), each of $R^{15}$ and $R^{16}$ which are independent of each other, is a $C_{1-10}$ alkyl group.

8. The photopolymerizable composition according to claim 1, wherein the cyanine dye of component (B) is a near infrared absorbing dye having an absorption band over the entirety or a part of the near infrared region with a wavelength range of from 700 to 1,300 nm.

9. The photopolymerizable composition according to claim 1, wherein the cyanine dye of component (B) is a cyanine dye having heterocyclic rings connected via a polymethine chain.

10. The photopolymerizable composition according to claim 9, wherein the cyanine dye of component (B) is a near infrared absorbing dye of the following Formula (II):

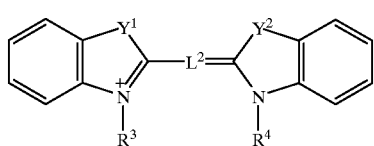

(II)

wherein each of $Y^1$ and $Y^2$ which are independent of each other, is a dialkylmethylene group or a sulfur atom, each of $R^3$ and $R^4$ which are independent of each other, is an alkyl group which may have a substituent, an alkenyl group which may have a substituent, an alkynyl group which may have a substituent, or a phenyl group which may have a substituent, $L^2$ is a tri-, penta-, hepta-, nona-, or undeca-methine group having at least one substituent (α), and two substituents on the penta-, hepta-, nona- or undeca-methine group, may be connected to each other to form a cyclic structure and the condensed benzene ring may have at least one substituent, whereby adjacent two substituents may be connected to each other to form a condensed benzene ring.

11. The photopolymerizable composition according to claim 10, wherein $L^2$ is a heptamethine group having at least one substituent (α), provided that two substituents on the heptamethine group may be connected to each other to form a cyclic structure.

12. The photopolymerizable composition according to claim 1, wherein the photopolymerization initiator of component (C) is a bis(trihalomethyl)-s-triazine compound.

13. A photopolymerizable lithographic printing plate comprising a support and a layer of a photopolymerizable composition formed on the surface of the support, wherein the polymerizable composition comprises (A) an ethylenically unsaturated compound, (B) a cyanine dye and (C) a photopolymerization initiator, wherein the cyanine dye of component (B) is a cyanine dye of a structure having hetero atoms connected via a polymethine chain, and the polymethine chain has at least one substituent of the following formula (α):

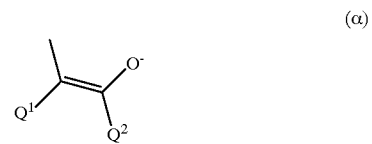

(α)

wherein $Q^1$ and $Q^2$ are optional substituents, which may be connected to form a ring.

14. A process for forming an image, which comprises exposing a photopolymerizable lithographic printing plate comprising a support and a layer of a photopolymerizable composition formed on the surface of the support, wherein the polymerizable composition comprises (A) an ethylenically unsaturated compound, (B) a cyanine dye and (C) a photopolymerization initiator, wherein the cyanine dye of component (B) is a cyanine dye of a structure having hetero atoms connected via a polymethine chain, and the polymethine chain has at least one substituent of the following formula (α):

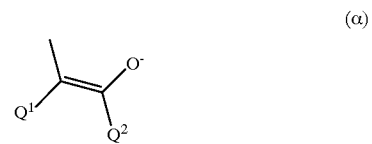

(α)

wherein $Q^1$ and $Q^2$ are optional substituents, which may be connected to form a ring, with a light of from 700 to 1,300 nm, followed by development with an alkali developer.

* * * * *